June 18, 1968 W. D. BOND 3,389,305

MOUNTING AND COOLING APPARATUS FOR SEMICONDUCTOR DEVICES

Filed Aug. 1, 1966

INVENTOR.

William D. Bond

BY

Thomas N. Young

ATTORNEY

United States Patent Office 3,389,305
Patented June 18, 1968

3,389,305
MOUNTING AND COOLING APPARATUS FOR SEMICONDUCTOR DEVICES

William D. Bond, Warren, Mich., assignor to General Motors Corporation, Detroit, Mich., a corporation of Delaware
Filed Aug. 1, 1966, Ser. No. 569,395
7 Claims. (Cl. 317—100)

ABSTRACT OF THE DISCLOSURE

A fluid cooled mounting structure for rectifiers and the like including a base member having a fluid passage which extends past a surface to be cooled and includes a nozzle for accelerating a jet of coolant against the surface to provide a scrubbing action. Serial flow between several devices may be provided by means of a ducted mounting board.

*Summary of the invention*

This invention relates to an arrangement for conveniently mounting and effectively cooling semiconductor devices, and more particularly, to a combination of apparatus by which semiconductor devices may be removably mounted on a prepared support and cooled by the circulation of a fluid coolant.

Semiconductor devices, such as rectifiers, transistors and diodes, may be mounted on boards by means of base members having a shoulder portion adjacent the semiconductor and a mounting stud which is adapted to extend through a hole in the mounting board. In such an arrangement, cooling of the device is generally accomplished by heat transfer through the shoulder and stud to a heat sink or to a coolant which contacts the exterior of the base member.

It is an object of the present invention to provide more effective cooling of semiconductor devices than is provided by the above-described prior art apparatus. This is accomplished by means of a base mounting member including a shoulder portion and a stud portion through which a fluid passage extends toward an interior surface of the shoulder portion adjacent and in heat transfer relation with a semiconductor device. The passage is provided with fluid inlet and outlet ports which permit the flow of a fluid coolant through the base member, thus bringing coolant into closer contact with the heat generating portion of the semiconductor device than has heretofore been accomplished.

It is a further object of the invention to prevent the build up of a sluggish film of coolant on the interior surface of the base member adjacent the semiconductor device. This is accomplished by the provision of nozzle means within the passage and intermediate the inlet and outlet ports for directing a high velocity jet of coolant against the interior surface. This jet provides a scrubbing action which prevents the film build up.

It is a further object of the invention to provide the afore-mentioned cooling and scrubbing effects in an arrangement which affords ease of service and simple removal and replacement of the semiconductor devices. This is accomplished through the combination of a prepared mounting board which may accommodate a plurality of semiconductor devices, each of which devices includes a base member having a shoulder portion to be abutted against a surface of the board and a stud portion which may be inserted into a hole in the board and secured in place by a retaining cap which is adapted for engagement with the end of the stud portion which protrudes through and beyond the mounting board.

These and other objects and advantages of the invention may be best understood from the following description of a specific embodiment of the invention. This description is to be taken with the accompanying drawings of which:

Figure 1:
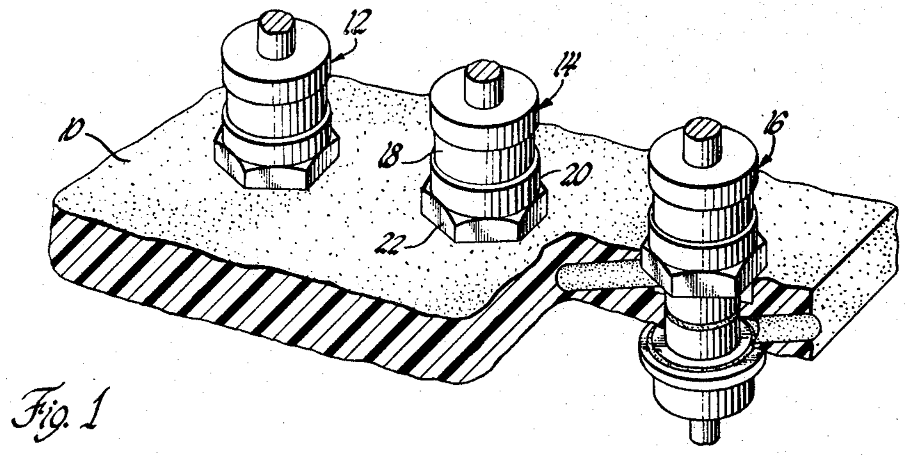
FIGURE 1 is a partially sectioned view of an illustrative semiconductor mounting arrangement employing the invention.

FIGURE 1 shows a section of fibrous mounting board 10 having semiconductor devices 12, 14 and 16 mounted thereon at uniformly spaced locations. Board 10 is substantially rigid, of substantially uniform thickness and defines, for purposes of discussion, upper and lower planar surfaces. The semiconductor devices may be silicon controlled rectifiers, each of which includes a heat generating crystal which requires cooling for effective operation. Device 14, which is representative, includes a body 18 integrally associated with a base member 20 which facilitates mounting on board 10. Base member 20 includes a flared shoulder portion 22 which is of hexagonal design to permit the application of a wrench.

Figure 2:
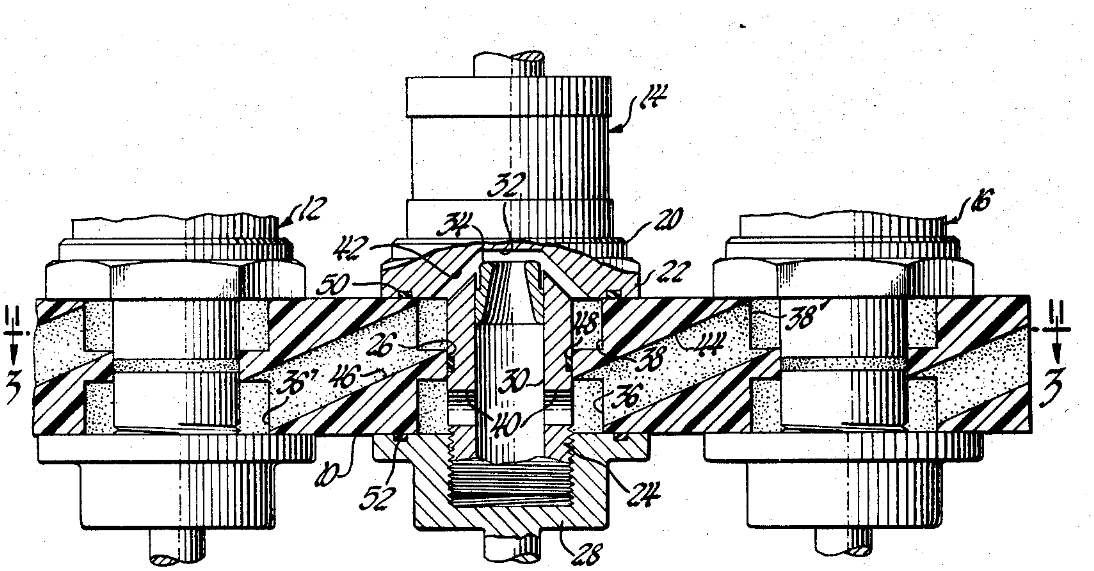
FIGURE 2 is a sectional view of an illustrative embodiment of the invention.
Figure 3:
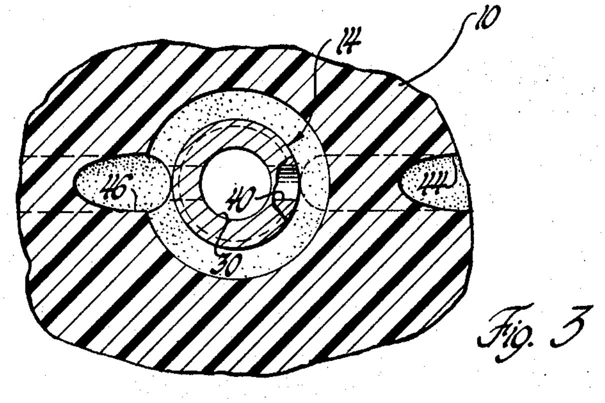
FIGURE 3 is a top sectional view of the FIGURE 2 arrangement taken along a line 3—3.

As best shown in FIGURES 2 and 3, the base member 20 includes a shoulder portion 22 of enlarged diameter which abuts the upper surface of board 10 and an elongated cylindrical stud portion 24. The stud portion is disposed snugly within a cylindrical bore 26 extending through the board 10. The length of stud portion 24 is greater than the thickness of board 10 and thus protrudes beyond the under-surface of the board. This protruding portion of stud 24 may be threaded to receive a retaining cap 28 which also includes a flared shoulder portion adapted to abut the under-surface of board 10 as shown in the drawing. It is seen that the semiconductor device 14 may be removed from its location in board 10 simply by disengaging the base member 20 from the retaining cap 28 and withdrawing the assembly from bore 26.

Base member 20 has formed therein a cylindrical and longitudinally extending fluid passage 30 which extends from the lower portion of stud 24 to an interior surface 32 of shoulder portion 22. Surface 32 is proximate and in good heat transfer relation with the heat generating crystal, not shown, of semiconductor device 14. A nozzle 34 is formed in the upper portion of passage 30 by the insertion of an annular sleeve having a tapered center bore as shown. Nozzle 34 produces a high velocity jet of any fluid traveling upwardly through passage 30 which jet impinges upon surface 32.

The bore 26 through board 10 is enlarged in diameter adjacent both the upper and lower surfaces thereof and for a depth of less than half the thickness of board 10. These enlargements form annular cavities 36 and 38 which, as will be described, are employed in the circulation of coolant through passage 30. Cavity 36 is part of the inlet system and is communicated with passage 30 by means of radially extending holes or inlet ports 40 formed in the stud 24. Cavity 38 forms parts of the outlet system and is communicated with the upper portion of passage 30 by radially extending outlet ports 42 formed in the shoulder 22. As previously described, each semiconductor location is similar to the others. Further, it may be advantageous to provide for some seriality in the flow of coolant from one device to another. Therefore, an upper or outlet cavity 38' of semiconductor device 16 is communicated with the inlet cavity 36 of device 14 by means of a passage 44 which is bored through the board 10 on an angle as shown in the drawing. Similarly, outlet cavity 38 of device 14 may be connected with inlet cavity 36' of device 12 by means of a bored passage 46. The diameters of the shoulder portion 22 and the cap 28 are greater than that of the cavities 36, 38 thereby to close the cavities when in place.

Fluid leakage is prevented between cavities 36 and 38 by the insertion of a sealing ring 48 into an annular groove formed at a central location of stud 24. Sealing ring 48 engages the cylindrical surface of bore 26. Additional sealing rings 50 and 52 are disposed in the shoulder portion 22 and retaining cap 28, respectively, to prevent leakage of fluid from the annular cavities 36 and 38 to the exterior of board 10.

In operation, a fluid coolant is supplied under low pressure to an entry point in the continuous conduit defined by passage 44, ports 40, passage 30, port 42 and passage 46. Coolant flows in series from the semiconductor device 16 to device 14 to device 12. Alternatively, a parallel fluid-flow path or a path to a single semiconductor device may be employed as suits the particular situation. Coolant from passage 44 flows around annular cavity 36 and through inlet ports 40 to the passage 30. Fluid flowing up through passage 30 encounters nozzle 34 which increases the velocity of flow and directs the resulting jet against surface 32. This jet produces a scrubbing action which prevents fluid film build-up while effectively cooling semiconductor device 14. Fliud exits through ports 42 to annular cavity 38 and thence through passage 46.

It will be appreciated from the foregoing description and accompanying drawings that the arrangement produces effective cooling of semiconductor devices yet allows such devices to be removed for service by the simple disengagement of a threaded retaining cap. Additionally, all parts, including mounting board 10, may be simply and inexpensively fabricated to provide the fluid network described above.

It is to be further understood that the embodiment described herein is illustrative in nature and not to be construed in a limiting sense. For a definition of the invention, reference should be had to the appended claims.

I claim:

1. Cooling apparatus for semiconductor devices comprising a base member integrally associated with the semiconductor device, a fluid passage formed within the base member and extending from an inlet port to a surface in heat transfer relation with the semiconductor device, an outlet port formed within the base member and extending said passage adjacent said surface to the exterior of the base member, and fluid nozzle means disposed within the passage intermediate the inlet port and said surface for directing a jet of fluid coolant traveling said passage against said surface.

2. Apparatus as defined in claim 1 wherein the base member includes a radially enlarged shoulder portion adapted for mating relation with one surface of a mounting board having two opposite planar surfaces, a stud portion extending longitudinally from the shoulder portion adapted to be inserted into a hole in the mounting board, and said passage extends longitudinally through the stud and the shoulder portions.

3. Apparatus as defined in claim 2 wherein the stud portion is threaded from the end thereof farthest from the shoulder portion, the combination further including a retaining cap adapted for threaded engagement with the stud portion as it may extend through and beyond the opposite surface of the mounting board.

4. In combination, a mounting board for semiconductor devices and having two opposite planar surfaces, at least one cylindrical bore formed within the board and communicating between the surfaces, fluid inlet and outlet passages formed within the board and communicating with respective portions of the bore against the opposite surfaces thereof, a base member integrally associated with a semiconductor device in heat transfer relation and comprising a cylindrical stud portion insertable into the bore, and a shoulder portion engaging the surface of the board when the stud portion is inserted into the bore, a fluid passage extending through the stud and shoulder portions to a surface adjacent the semiconductor device, said fluid passage communicating with the inlet and outlet passages of the board, and a fluid nozzle disposed within the passage for directing a jet of fluid coolant traveling the passage against the surface.

5. The combination defined in claim 4 wherein the mounting board contains at least a second cylindrical bore having fluid inlet and outlet passages communicating therewith similarly to said one bore, the fluid inlet of the second bore being contiguous with the fluid outlet of the one bore.

6. The combination defined in claim 4 wherein the length of the stud portion is greater than the thickness of the board and is threaded on the end remote from the shoulder portion, the combination further including a retaining cap engaging the stud portion thereby to removably secure the base member to the mounting board.

7. In combination, a mounting board for semiconductor assemblies and having opposite parallel plane surfaces, a plurality of spaced apart cylindrical bores formed in the board between the surfaces, the diameter of the bores being enlarged for a portion adjacent each of the surfaces to form two annular cavities, fluid passages formed in the board between the cavity of a first bore adjacent one surface and the cavity of a second bore adjacent the opposite surface, a base member integrally associated with a semiconductor device and comprising a stud portion insertable through a bore to isolate the cavities, thereof, and a shoulder portion for abutting one of the board surfaces for sealing the cavity adjacent said one surface, the base member being in heat transfer relation with a semiconductor device, a fluid passage extending longitudinally through the stud portion to an interior surface of the shoulder portion, inlet ports communicating one end of the passage with the cavity adjacent said one surface, outlet ports communicating the other end of the passage with the other cavity, nozzle means disposed within the passage intermediate the ends thereof for directing a jet of fluid against the interior surface, and a retaining cap engageable with the stud portion and in abutment with the other board surface for sealing the other cavity and for retaining the base member in position within the board.

References Cited

UNITED STATES PATENTS

| | | |
|---|---|---|
| 2,815,473 | 12/1957 | Ketteringham et al. |
| 2,992,372 | 7/1961 | Himeon et al. |

FOREIGN PATENTS

| | | |
|---|---|---|
| 887,568 | 1/1962 | Great Britain. |

ROBERT K. SCHAEFER, *Primary Examiner.*

M. GINSBURG, *Examiner.*